United States Patent
Zeng et al.

(10) Patent No.: US 7,723,659 B1
(45) Date of Patent: May 25, 2010

(54) SYSTEM AND METHOD FOR SCREENING SEMICONDUCTOR LASERS

(75) Inventors: Ke-Cai Zeng, Fremont, CA (US); Steven Sanders, Los Altos, CA (US); Yansun Xu, Mountain View, CA (US)

(73) Assignee: Cypress Semiconductor Corporation, San Jose, CA (US)

( * ) Notice: Subject to any disclaimer, the term of this patent is extended or adjusted under 35 U.S.C. 154(b) by 0 days.

(21) Appl. No.: 12/287,604

(22) Filed: Oct. 10, 2008

(51) Int. Cl.
G01J 1/32 (2006.01)
(52) U.S. Cl. .................................... 250/205; 250/208.1
(58) Field of Classification Search ................. 250/205, 250/208.1, 214 R, 221; 345/157–167; 372/29.012–29.015
See application file for complete search history.

(56) References Cited

U.S. PATENT DOCUMENTS

| | | | |
|---|---|---|---|
| 3,922,093 A | 11/1975 | Dandliker et al. | |
| 4,225,240 A | 9/1980 | Balasubramanian | |
| 4,546,347 A | 10/1985 | Kirsch | |
| 4,740,675 A | 4/1988 | Brosnan et al. | |
| 4,751,380 A | 6/1988 | Victor et al. | |
| 4,799,055 A | 1/1989 | Nestler et al. | |
| 4,814,553 A | 3/1989 | Joyce | |
| 4,920,260 A | 4/1990 | Victor et al. | |
| 5,052,027 A | 9/1991 | Poklemba et al. | |
| 5,288,993 A | 2/1994 | Bidiville et al. | |
| 5,345,527 A | 9/1994 | Lebby et al. | |
| 5,391,868 A | 2/1995 | Vampola et al. | |
| 5,448,508 A | 9/1995 | Ono et al. | |
| 5,473,344 A | 12/1995 | Bacon et al. | |
| 5,578,813 A | 11/1996 | Allen et al. | |
| 5,606,174 A | 2/1997 | Yoshimura et al. | |
| 5,644,139 A | 7/1997 | Allen et al. | |
| 5,703,356 A | 12/1997 | Bidiville et al. | |
| 5,729,008 A | 3/1998 | Blalock et al. | |
| 5,729,009 A | 3/1998 | Dandliker et al. | |
| 5,781,229 A | 7/1998 | Zediker et al. | |
| 5,786,804 A | 7/1998 | Gordon | |
| 5,825,044 A | 10/1998 | Allen et al. | |
| 5,854,482 A | 12/1998 | Bidiville et al. | |
| 5,907,152 A | 5/1999 | Dandliker et al. | |
| 5,963,197 A | 10/1999 | Bacon et al. | |
| 5,994,710 A | 11/1999 | Knee et al. | |

(Continued)

OTHER PUBLICATIONS

USPTO Miscellaneous Action for U.S. Appl. No. 11/123,525 dated Jun. 10, 2005; 1 page.

(Continued)

*Primary Examiner*—Que T Le

(57) ABSTRACT

A system and method are provided for screening a semiconductor laser. The method includes: (i) operating the laser at a first of a number of drive currents; (ii) acquiring a number (N) of frames of data from a sensor in an optical navigation system (ONS) receiving speckle pattern in light from the laser reflected from a surface proximal to the ONS, the sensor data including differential signal values; (iii) calculating an average differential signal value (AVG) for the N frames of data; (iv) sorting the N frames of data across a plurality of bins including a Bin_0 for frames of data having a differential signal value within a predetermined amount of the AVG; and (v) determining if a number of frames of data in any bins other than Bin_0 exceed a predetermined threshold, and if so recording the drive current.

20 Claims, 11 Drawing Sheets

U.S. PATENT DOCUMENTS

| | | | |
|---|---|---|---|
| 6,031,218 | A | 2/2000 | Piot et al. |
| 6,034,379 | A | 3/2000 | Bunte et al. |
| 6,037,643 | A | 3/2000 | Knee |
| 6,057,540 | A | 5/2000 | Gordon et al. |
| 6,097,371 | A | 8/2000 | Siddiqui et al. |
| 6,137,566 | A | 10/2000 | Leonard et al. |
| 6,151,015 | A | 11/2000 | Badyal et al. |
| 6,172,354 | B1 | 1/2001 | Adan et al. |
| 6,194,695 | B1 | 2/2001 | Barrows |
| 6,201,572 | B1 | 3/2001 | Chou |
| 6,225,617 | B1 | 5/2001 | Dandliker et al. |
| 6,233,368 | B1 | 5/2001 | Badyal et al. |
| 6,243,134 | B1 | 6/2001 | Beiley |
| 6,281,881 | B1 | 8/2001 | Siddiqui et al. |
| 6,281,882 | B1 | 8/2001 | Gordon et al. |
| 6,326,950 | B1 | 12/2001 | Liu |
| 6,330,057 | B1 | 12/2001 | Lederer et al. |
| 6,351,257 | B1 | 2/2002 | Liu |
| 6,396,479 | B2 | 5/2002 | Gordon |
| 6,421,045 | B1 | 7/2002 | Venkat et al. |
| 6,424,407 | B1 | 7/2002 | Kinrot et al. |
| 6,433,780 | B1 | 8/2002 | Gordon et al. |
| 6,452,683 | B1 | 9/2002 | Kinrot et al. |
| 6,455,840 | B1 | 9/2002 | Oliver et al. |
| 6,462,330 | B1 | 10/2002 | Venkat et al. |
| 6,476,970 | B1 | 11/2002 | Smith |
| 6,529,184 | B1 | 3/2003 | Julienne |
| 6,585,158 | B2 | 7/2003 | Norskog |
| 6,603,111 | B2 | 8/2003 | Dietz et al. |
| 6,608,585 | B2 | 8/2003 | Benitz |
| 6,621,483 | B2 | 9/2003 | Wallace et al. |
| 6,642,506 | B1 | 11/2003 | Nahum et al. |
| 6,657,184 | B2 | 12/2003 | Anderson et al. |
| 6,664,948 | B2 | 12/2003 | Crane et al. |
| 6,674,475 | B1 | 1/2004 | Anderson |
| 6,677,929 | B2 | 1/2004 | Gordon et al. |
| 6,703,599 | B1 | 3/2004 | Casebolt et al. |
| 6,737,636 | B2 | 5/2004 | Dietz et al. |
| 6,741,335 | B2 | 5/2004 | Kinrot et al. |
| 6,753,851 | B2 | 6/2004 | Choi et al. |
| 6,774,351 | B2 | 8/2004 | Black |
| 6,774,915 | B2 | 8/2004 | Rensberger |
| 6,795,056 | B2 | 9/2004 | Norskog et al. |
| 6,809,403 | B2 | 10/2004 | Gee |
| 6,809,723 | B2 | 10/2004 | Davis |
| 6,819,314 | B2 | 11/2004 | Black |
| 6,823,077 | B2 | 11/2004 | Dietz et al. |
| 6,950,094 | B2 | 9/2005 | Gordon et al. |
| 6,967,321 | B2 | 11/2005 | Leong et al. |
| 6,977,645 | B2 | 12/2005 | Brosnan |
| 7,019,733 | B2 | 3/2006 | Koay |
| 7,042,575 | B2 | 5/2006 | Carlisle et al. |
| 7,049,578 | B2 | 5/2006 | Wada et al. |
| 7,119,323 | B1 | 10/2006 | Brosnan et al. |
| 7,126,585 | B2 | 10/2006 | Davis et al. |
| 7,138,620 | B2 | 11/2006 | Trisnadi et al. |
| 7,148,078 | B2 | 12/2006 | Moyer et al. |
| 7,161,682 | B2 | 1/2007 | Xie et al. |
| 7,205,521 | B2 | 4/2007 | Gruhlke et al. |
| 7,247,832 | B2 | 7/2007 | Webb |
| 7,248,345 | B2 | 7/2007 | Todoroff et al. |
| 7,250,893 | B2 | 7/2007 | Todoroff et al. |
| 7,253,837 | B2 | 8/2007 | Henderson et al. |
| 7,268,341 | B2 * | 9/2007 | Lehoty et al. ............ 250/221 |
| 7,279,668 | B2 | 10/2007 | Misek |
| 7,280,140 | B2 | 10/2007 | Henderson |
| 7,297,912 | B1 | 11/2007 | Todoroff et al. |
| 7,298,460 | B2 | 11/2007 | Xu et al. |
| 7,321,359 | B2 | 1/2008 | Xie et al. |
| 7,439,954 | B2 | 10/2008 | Theytaz et al. |
| 7,443,427 | B2 | 10/2008 | Takayanagi |
| 7,460,979 | B2 | 12/2008 | Buckner |
| 7,492,351 | B2 | 2/2009 | VanWiggeren et al. |
| 2002/0093487 | A1 | 7/2002 | Rosenberg |
| 2003/0058506 | A1 | 3/2003 | Green et al. |
| 2005/0083303 | A1 | 4/2005 | Schroeder et al. |
| 2005/0258346 | A1 | 11/2005 | LeHoty et al. |
| 2005/0259078 | A1 | 11/2005 | Roxlo et al. |
| 2005/0259097 | A1 | 11/2005 | Lehoty et al. |
| 2005/0285960 | A1 | 12/2005 | Purcell et al. |
| 2006/0028442 | A1 | 2/2006 | Bynum et al. |
| 2006/0118743 | A1 | 6/2006 | Lang |
| 2007/0057157 | A1 | 3/2007 | Trisnadi et al. |
| 2007/0138377 | A1 | 6/2007 | Zarem |
| 2007/0143383 | A1 | 6/2007 | Xu et al. |

OTHER PUBLICATIONS

USPTO Non-Final Rejection for U.S. Appl. No. 11/123,52 dated Apr. 14, 2008; 20 pages.

International Search Report of the International Searching Authority for Application No. PCT/US2005/017375 dated Oct. 2, 2006; 2 pages.

USPTO Notice of Allowance for U.S. Appl. No. 11/123,326 dated Jul. 9, 2007; 4 pages.

USPTO Non-Final Rejection for U.S. Appl. No. 11/123,326 dated Mar. 21, 2007; 6 pages.

USPTO Miscellaneous Actions for U.S. Appl. No. 11/123,326 dated Jun. 8, 2005; 1 page.

R.E. Kalman, "A New Approach to Linear Filtering and Prediction Problems," Transactions of the ASME-Journalof Basic Engineering, Copyright 1960, Research Institute for Advanced Study; Batimore, MD; 12 pages.

USPTO Non-Final Rejection for U.S. Appl. No. 11/123,500 dated Apr. 11, 2008; 17 pages.

USPTO Miscellaneous Action for U.S. Appl. No. 11/123,500 dated Jun. 8, 2005: 1 page.

"The Examiners Grounds for Rejection" from Korean Patent Office for Patent Application No. 10-2006-7026956; Dec. 31, 2007, 4 pages.

International Search Report of the International Searching Authority for International Application No. PCT/US2005/017459 dated Sep. 26, 2006, 2 pages.

The Written Opinion of the International Searching Authority for International Application No. PCT/US2005/017459 dated Sep. 26. 2006, 2 pages.

USPTO Notice of Aowance for U.S. Appl. No. 11/128,988 dated Feb. 2, 2006; 7 pages.

USPTO Non-Final Rejection for U.S. Appl. No. 11/123,527 dated Apr. 9, 2008; 18 pages.

International Search Report of the International Searching Authority for International Application No. PCT/US2005/017461 dated Nov. 23, 2006; 3 pages.

USPTO Notice of Allowance for U.S. Appl. No. 11/261,316 dated Aug. 23, 2006; 6 pages.

USPTO Non-Final Rejection: for U.S. Appl. No. 11/261,316 dated Jun. 6, 2006. 6 pages.

USPTO Notice of Allowance for U.S. Appl. No. 11/582,776 dated May 16, 2008: 6 pages.

USPTO Non-Final Rejection for U.S. Appl. No. 11/582,776 dated Sep. 10, 2007; 8 pages.

USPTO Notice of Allowance for U.S. Appl. No. 11/292,470 dated May 30, 2008; 7 pages.

USPTO Final Rejection for U.S. Appl. No. 11/292,470 dated Sep. 19, 2007; 10 pages.

USPTO Non-Final Rejection, for U.S. Appl. No. 11/292,470 dated Jan. 17, 2007; 12 pages.

USPTO Notice of Allowance for U.S. Appl. No. 11/268,898 dated Apr. 19, 2007; 9 pages.

USPTO Final Rejection for U.S. Appl. No. 11/303,365 dated Jan. 2, 2008; 11 pages.

USPTO Non-Final Rejection for U.S. Appl. No. 11/303,365 dated Apr. 2, 2007; 13 pages.

USPTO Notice of Allowance for U.S. Appl. No. 11/271,039 dated Jun. 5, 2007; 7 pages.

USPTO Final Rejection for U.S. Appl. No. 11/271,039 dated Mar. 16, 2007, 8 pages.

USPTO Non-Final Rejection for U.S. Appl. No. 11/271,039 dated Aug. 8, 2006; 7 pages.

USPTO Notice of Allowance for U.S. Appl. No. 11/223,389 dated Apr. 26, 2007; 7 pages.

USPTO Final Rejection for U.S. Appl. No. 11/223;389 dated Mar. 5, 2007; 5 pages.

USPTO Non-Final Rejection for U.S. Appl. No. 11/223;389 dated Jun. 26, 2006; 12 pages.

USPTO Notice of Allowance for U.S. Appl. No. 11/303,363 dated Sep. 17, 2009; 4 pages.

USPTO Non-Final Rejection for U.S. Appl. No. 11/303,363 dated Apr. 16, 2009; 4 pages.

USPTO Notice of Allowance for U.S. Appl. No. 11/324,424 dated Oct. 2, 2007; 4 pages.

USPTO Non-Final Rejection for U.S. Appl. No. 11/324,424 dated Apr. 12, 2009; 6 pages.

USPTO Notice of Allowance for U.S. Appl. No. 11/389,903 dated Sep. 19, 2007; 7 pages.

* cited by examiner

SYSTEM AND METHOD FOR SCREENING SEMICONDUCTOR LASERS

TECHNICAL FIELD

The present disclosure relates generally to lasers, and more particularly to systems and methods for screening semiconductor lasers.

BACKGROUND

Semiconductor lasers are widely used in a variety of applications including optical navigation systems (ONS) used to track movement of the ONS relative to a surface. One type of ONS increasingly used in, for example, optical computer mice may be a speckle-based ONS. In a speckle-based ONS, movement between the system and the surface may be sensed based on displacement of a complex intensity distribution pattern, known as speckle, which may be generated by scattering coherent light from a semiconductor laser off an optically rough surface. Because speckle may be produced by interference of reflected light, speckle-based ONSs are polarization and/or frequency sensitive such that a shift in a state of polarization (SOP) of the laser could result in an abrupt, erroneous indication of movement. For this reason, semiconductor lasers used in such applications must have a stable fixed SOP.

One type of semiconductor laser frequently used in speckle-based ONS's may be a vertical cavity surface-emitting laser (VCSEL). VCSEL's are used due to their lower manufacturing costs, reliability, and symmetrical optical output. VCSELs are manufactured by forming two distributed Bragg reflector mirrors, each including multiple layers of alternating materials with varying refractive index on a semiconductor substrate. Laser beams are emitted perpendicular from a top surface of the VCSEL and are polarized along crystallographic planes of the layers. As a result, VCSELs can quickly switch states of polarization and/or emit light simultaneously from multiple SOPs. Conventional approaches to solving SOP switching or hopping include using polarization stabilized VCSEL's, which typically have higher cost.

SUMMARY

A system and method are provided for screening a semiconductor laser. Generally, the method includes: (i) operating the laser at a first of a number (D) of discrete drive currents in a range of drive currents; (ii) acquiring a number (N) of frames of data from a sensor in an optical navigation system (ONS) receiving speckle pattern in light from the laser reflected from a surface proximal to the ONS, the sensor data including differential signal values; (iii) calculating an average differential signal value (AVG value) for the N frames of data; (iv) sorting the N frames of data across a plurality of bins, the plurality of bins including at least a Bin_0 for frames of data having a differential signal value within a predetermined amount of the AVG value; and (v) determining if a number of frames of data in any of the plurality of bins other than Bin_0 exceed a predetermined threshold, and if the number of frames of data in any of the plurality of bins exceed the predetermined threshold, recording the drive current.

BRIEF DESCRIPTION OF THE DRAWINGS

These and various other features of the interface device and methods for using the same will be apparent upon reading of the following detailed description in with the accompanying drawings and the appended claims provided below, where:

DETAILED DESCRIPTION

Figure 1:
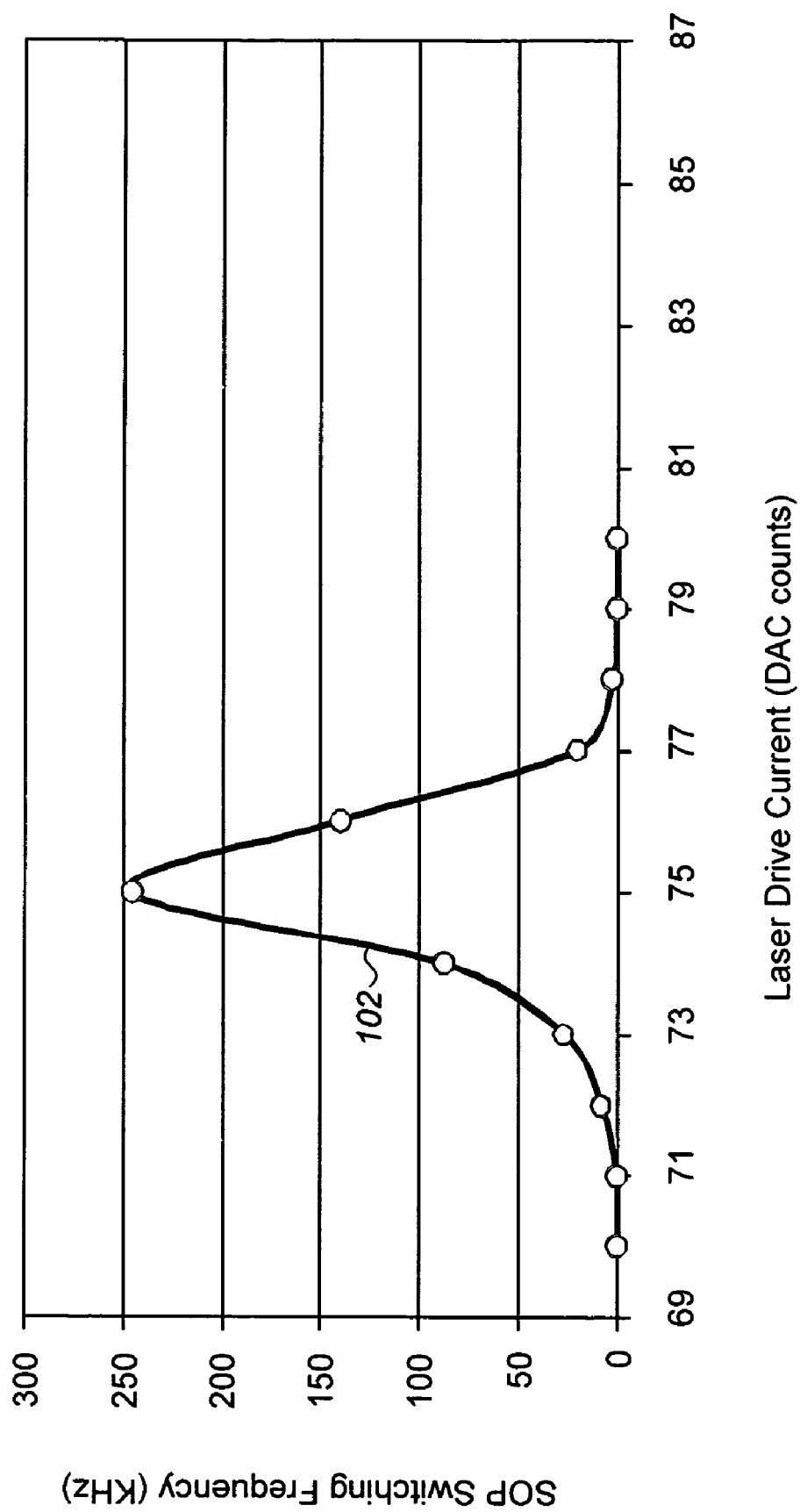
FIG. 1 may be a graph illustrating a rate or frequency of state of polarization (SOP) switching for an embodiment of a semiconductor laser as a function of drive current.

A system and method are provided for screening semiconductor lasers used in speckle-based optical navigation system (ONS) to suppress state of polarization (SOP) switching or hopping of the laser. Because speckle may be produced by interference of reflected light, speckle-based ONS are polarization sensitive such that a shift in the SOP of the laser could result in an abrupt, erroneous indication of movement. As noted above, vertical cavity surface-emitting lasers (VCSELs), which produce light polarized along crystallographic planes of multiple layers of alternating materials of the laser, are particularly susceptible to SOP switching.

Briefly, embodiments of a method, algorithm, and system are provided for screening polarization switching versus driving current of a semiconductor laser to suppress spurious motion in a speckle-based ONS. Generally, the system includes: (i) a test system and a fast test algorithm for detecting VCSEL driving current where the VCSEL would exhibit SOP switching; (ii) a method and algorithm in the ONS to program firmware (FW) controlling a laser driver to avoid operating the VCSEL at a drive current where the VCSEL would exhibit SOP switching, thereby suppressing spurious motion. More specifically, the test system includes a test board with at least one test socket for a sensor of a speckle-based ONS, and an optically rough surface at a predetermined distance from the ONS sensor so that scattered light may be projected onto the ONS sensor.

According to an embodiment, the fast test algorithm includes: (i) operating the laser of the ONS sensor at a first of a number (D) of discrete drive currents in a predetermined range of drive currents; (ii) acquiring a number (N) of frames of data including digitized differential signal values from the sensors in the ONS receiving speckle pattern in light from the laser scattered from the surface; (iii) calculating an average differential signal value (AVG) for the N frames of data; (iv) sorting the N frames of data across a plurality of bins, the plurality of bins including at least a Bin_0 for frames of data around the AVG; and (v) determining if data value in any bins other than Bin_0 exceed a predetermined threshold, and if the number of frames of data in any other bins exceed a predetermined threshold, recording the drive current as a VCSEL SOP unstable drive current.

According to an embodiment, at the end of testing, a VCSEL SOP unstable zone may be identified from the VCSEL SOP unstable drive current, and the FW programmed to exclude operation in the VCSEL SOP unstable zone.

Methods, algorithms, and systems according to various embodiments will now be described in greater detail with reference to FIGS. 1 through 10. For purposes of clarity, many of the details of semiconductor lasers and systems or circuits including in general and optical systems sensors in particular, which are widely known and not relevant to the present system and method have been omitted from the following description. Optical navigation systems are described, for example, in commonly assigned U.S. Pat. No. 7,138,620, entitled, "Two-Dimensional Motion Sensor," by Jahja Trisnadi et al., issued on Nov. 21, 2006.

It has been found that the rate or frequency of SOP switching or hopping in VCSELs may be strongly dependent on driving current, ambient temperature and physical stress on the VCSEL. According to an embodiment, FIG. 1 illustrates a graph 102 of the frequency or number of occurrences SOP switching events over a predetermined period of time detected for a semiconductor laser as a function of the power or drive current to the laser. In this and following figures drive current to the laser may be expressed as a digital to analog conversion (DAC) points or counts stored in a drive current control register (not shown) and used to control the current provided from a driver circuit. The data on SOP switching for FIG. 1 was acquired using a packaged VCSEL maintained at a steady temperature of about 22° C. to eliminate substantially any change in SOP switching due to variations in physical stress or temperature of the laser. Referring to FIG. 1, it may be seen that there may be a band or range, referred to hereinafter as the SOP unstable zone, of laser drive currents extending from about 71 to about 79 DAC counts where SOP switching may be particularly frequent or severe. Thus, the SOP unstable zone, which can vary for each VCSEL, may be identified. In an embodiment, a drive current outside of this zone may be selected.

Figure 2:
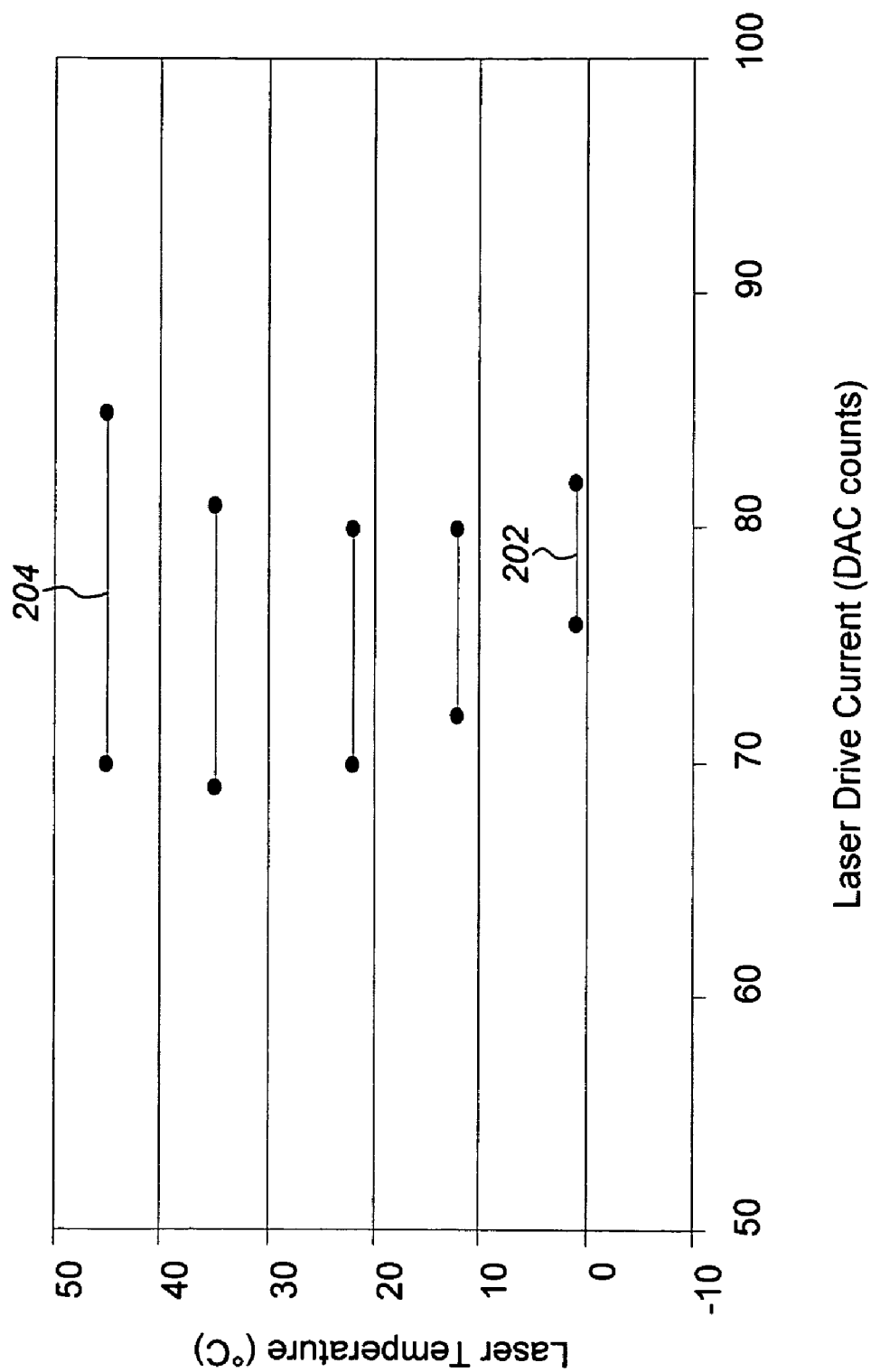
FIG. 2 may be a graph illustrating effect of laser temperature on SOP switching and SOP unstable zones for a range of laser temperatures according to an embodiment.

According to an embodiment, FIG. 2 illustrates the effect of laser temperature on the SOP unstable zone of a single laser operated at various temperatures ranging from about 0° C. to about 45° C., represented by graphs of lines 202 through 204. Referring to FIG. 2, it may be seen that a width or magnitude of the SOP unstable zones increase proportionally with increasing ambient laser temperature from a low width of about 7 DAC counts (represented by line 202) at a temperature of about 0° C. to a maximum width of about 15 DAC counts (represented by line 204) at a temperature of about 45° C.

From the embodiments illustrated in graphs of FIGS. 1 and 2, it is shown that screening semiconductor lasers (VCSELs) may be effective at a backend of a packaging process in which the laser-undergoing screening has been substantially packaged on a common die or substrate with an ONS. Packaging not only stabilizes physical stress on the laser, eliminating variations in SOP due to changes in physical stress, it minimizes or insulates the VCSEL from changes in temperature. Thus, performing this screening at the backend substantially eliminates changes due to changing physical stress on an unpackaged laser and enables testing to be performed at a controlled VCSEL temperature.

Figure 3:
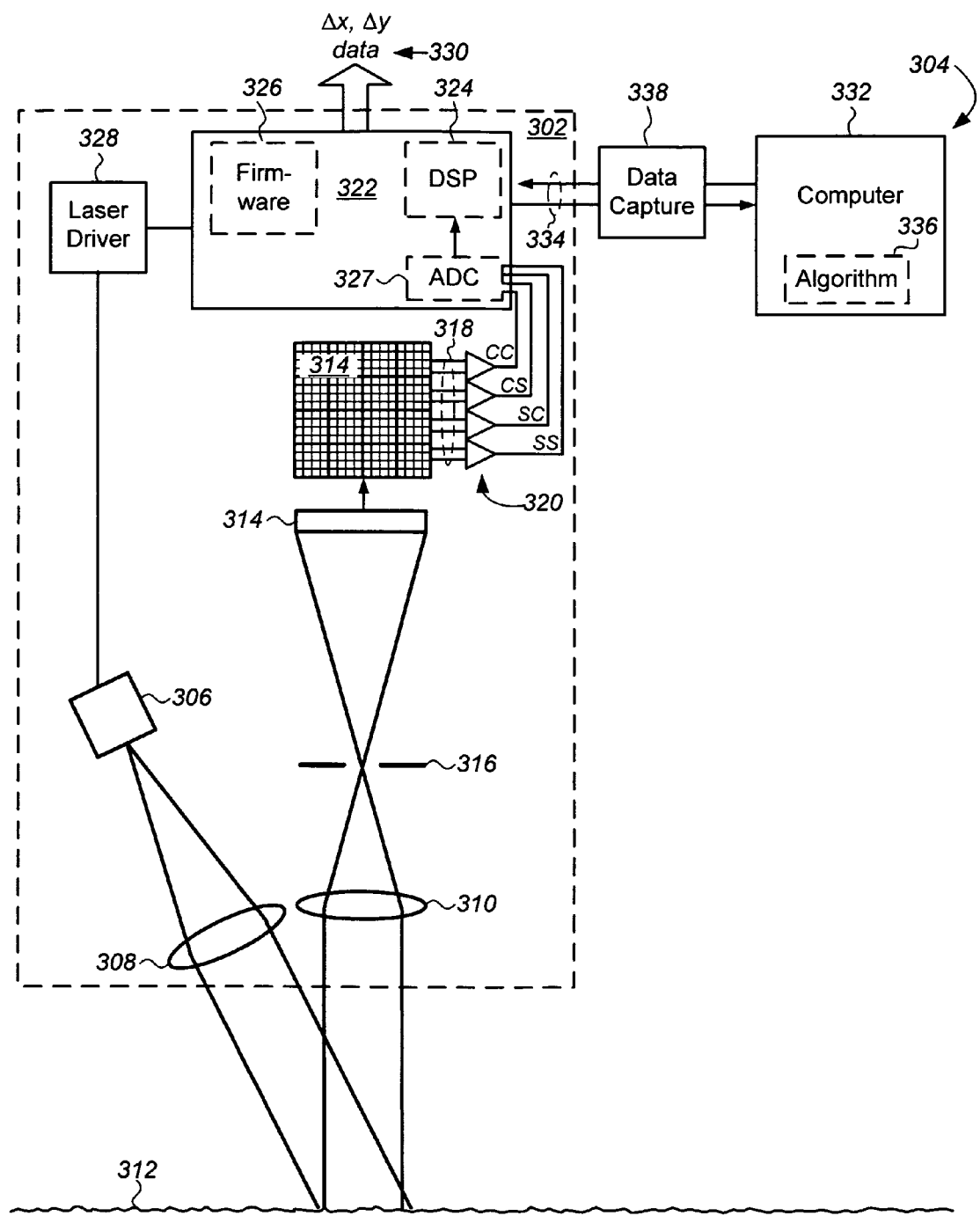
FIG. 3 may be a schematic block diagram of a speckle-based optical navigation system (ONS) and a test system for screening a semiconductor laser of the ONS according to one embodiment.

FIG. 3 shows a block diagram of an embodiment of a speckle-based optical navigation system (ONS 302) and a test system 304 for screening a semiconductor laser of the ONS. Laser speckle, it may be meant a random distribution of light intensity due to coherent light interference.

Referring to FIG. 3, an optical portion of the ONS 302 generally includes a semiconductor laser 306, a collimating lens 308 to collimate a diverging light beam, imaging optics including an imaging lens 310 to project a portion of the speckle light reflected from an optically rough, scattering surface 312 to a sensor-array 314 at an image plane of the imaging lens. The imaging optics may include an aperture 316 at a back focal plane of the imaging lens 310 to provide good speckle pattern integrity during relative motion between the ONS 302 and scattering surface 312 and to match an average size of the speckle to a period of the sensor-array 314. The sensor-array 314, which includes multiple photosensitive elements, such as photodiodes (PDs), determines a direction and magnitude of movement of ONS 302 relative to the surface 312 by detecting changes in the speckle pattern of light scattered from the surface.

In an embodiment, it will be understood, that the method and test system of the present disclosure may be applicable to most, if not all, speckle-based ONS 302. Thus, the semiconductor laser 306 can include any suitable narrow-band or coherent light source, such as a vertical cavity surface-emitting laser (VCSEL), capable of producing speckle through interference in light scattered from the surface 312. Similarly, the sensor-array 314 can include one or more one-dimensional (1D) or two-dimensional (2D) sensor-arrays 314 of photosensitive elements, such as photodiodes (PDs). Note, the sensor array 314 is shown in both side-view and planar top-view to clearly show the 2D nature of this embodiment. Moreover, the sensor-array 314 can be either a periodic, comb-array that includes a number of regularly spaced photosensitive elements having 1D or 2D periodicity, quasi-periodic including Penrose tiling, or a non-periodic sensor-array, which has a regular pattern but does not include periodicities.

In the embodiment shown, the ONS sensor may be a 2D comb array of photosensitive elements or detectors, such as photodiodes (PD). An electronic portion of the ONS 302 includes a number of electrical lines from the sensor-array 314, each receiving a current or signal from a number of photosensitive elements or PDs within a period in the array, which are electrically connected (wired sum) to form eight signal lines 318 coming out from the sensor-array. Differential transimpedance amplifiers (TIAs 320) integrate current signals from the signal lines 318 to generate a set of four differential signals, labeled here as CC, CS, SC, and SS, which are the four signals that contains the in-phase and quadrature information in the x and y directions. Although a set of four TIA channels are shown in FIG. 1, the ONS 302 can include any number of sets of TIA channels depending on the number of dimensions, periodicity, and/or number of discrete arrays within the sensor-array 314. For example, in a sensor 314 having a 1D array, the ONS 302 can have only two TIA channels. However, as one TIA channel may be sufficient for the test system 304 and method of the present disclosure, embodiments of ONS 302 having additional or fewer TIA channels have been omitted to simplify the figures and accompanying description.

The electronic portion of the ONS 302 further includes a controller 322 comprising a digital signal processor (DSP 324) and firmware (FW 326), an analog-to digital-converter (ADC 327) and a laser driver 328 to provide a drive current to the semiconductor laser 306. In normal operation, the DSP 324 receives and combines differential signals from the TIA channels, which have been converted in the ADC 327, to provide measurements or data ($\Delta x$, $\Delta y$ data 330) on a magnitude and direction of displacement of the ONS 302 relative to the surface 312. FW 326 executes an embedded computer program to control operation of ONS 302 components including, for example, adjusting a current and duty cycle at which the laser 306 may be powered by the laser driver 328.

Referring to FIG. 3, the test system 304 generally includes a low-cost tester or computer 332 and a raw data capture buffer 338 coupled to the DSP 324 and controller 322 of the ONS 302 by a number of test connections 334, and capable of executing a test program and algorithm 336 determining at what drive currents SOP switching of the laser 306 occurs. Optionally, the computer 332 may further include executable programs or algorithms to set or program a drive current range in the controller 322 to substantially avoid SOP switching, and/or to identify for rejection any ONS 302 having a laser 306 exhibiting SOP switching at or near an industry standard eye safe power point for operating lasers.

Figure 4:
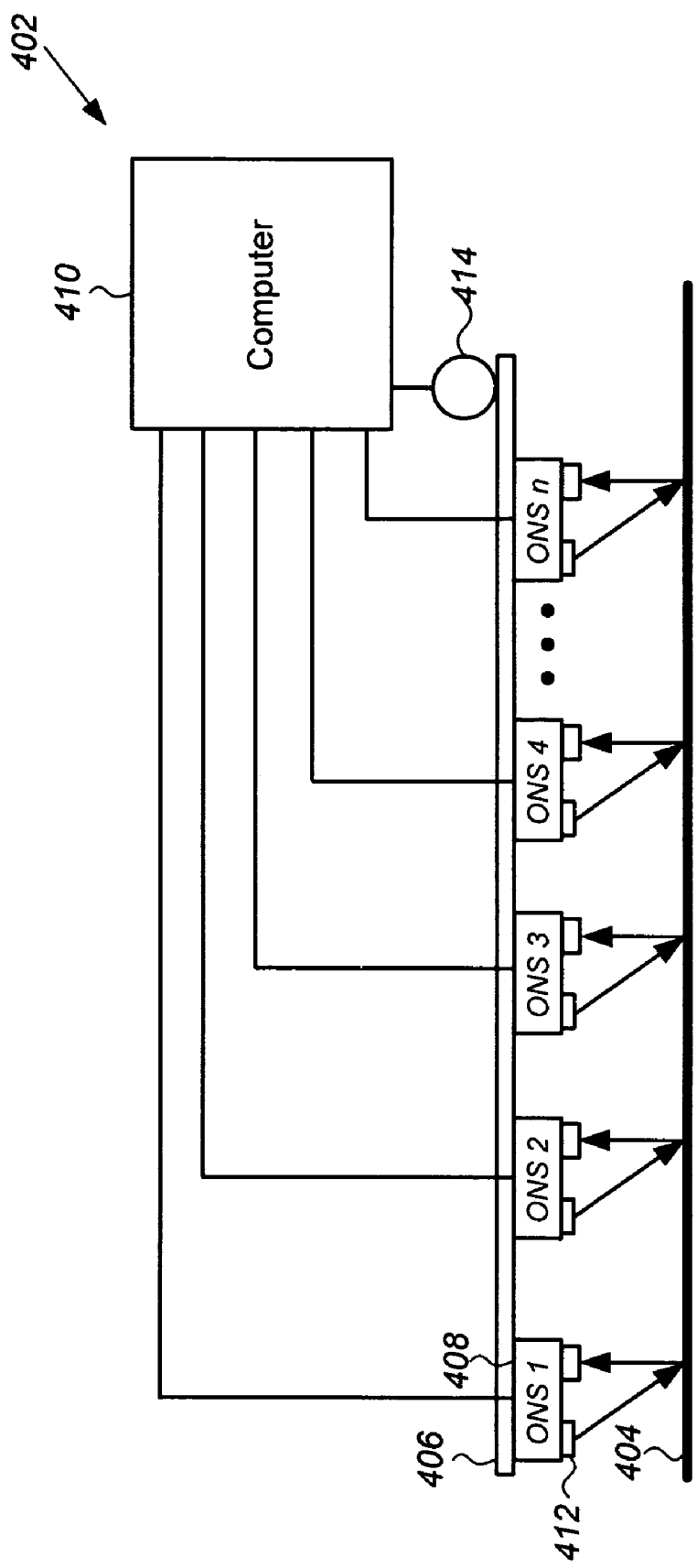
FIG. 4 may be a schematic block diagram of a test system including a movable stage and an optically rough surface for testing multiple ONS in-parallel according to one embodiment.

In another embodiment of the test system 402, shown in FIG. 4, the test system can further include a stationary scattering surface 404 and a movable carriage or stage 406 to which multiple ONS 408 are mounted for testing in-parallel. Referring to FIG. 4, in the embodiment shown the test system 402 includes a computer 410, which operates the lasers 412 of ONS 408 at a number of discrete drive currents within a predetermined range of drive currents while checking for SOP switching using a method and algorithm described in detail below. Optionally, the test system 402 further includes a number of actuators 414, such as electric motors or pneumatic cylinders, to move the carriage or stage 406 to provide relative motion between the ONS 408 and the scattering surface 404 during screening or testing.

An embodiment of a method of performing a backend test for screening a semiconductor laser will now be described with reference to the flowchart of FIG. 5. By backend test, it may be meant a test that may be performed at the end of a packaging process in which the ONS including the laser and sensor-array have been substantially packaged on a common die or substrate. Performing this test at the backend substantially eliminates SOP switching or changes due to changing physical stress on the laser. In addition, backend testing provides data related to the SOP unstable zone, and, optionally, enables the ONS to be programmed following testing to avoid drive currents in the SOP unstable zone.

For purposes of clarification, the method of performing a backend test illustrated in FIG. 5, will be described with reference to an exemplary embodiment of a VCSEL having a threshold current may be around 2.0 mA and operating in CW mode. Power to the laser may be provided from the laser driver in response to a digital to analog conversion (DAC) count stored in a drive current control register (not shown) in the laser driver or FW. The exemplary VCSEL has a drive current resolution of about 43 uA/count, and a drive current slope efficiency of about 0.35 mW/mA. Thus, each increase in DAC count stored in the drive current control register provides an increase in drive current to the laser equal to about 43*0.35 or about 15 uW/count. Since lasers used in speckle-based ONS generally have a threshold of about 2.0 mA, corresponding to 46 DAC counts, and an eye-safe calibration target setting of about 4.0 mA or 88 DAC counts, the backend test program can be configured to sweep drive current starting from initial value of about 46 DAC counts up to 96 DAC counts in 1 count steps or increments, each count providing an additional 15 uW increase in VCSEL emission power. If a VCSEL with a different threshold and electrical-current-to-optical power efficiency may be used, the sweeping range can be refined so that VCSEL SOP unstable current zones may be covered by the screening tests.

In this exemplary embodiment, the sensor-array may be configured to operate at a fixed 40 kHz frame rate to enable the test system to acquire a number (N) of frames of data at each drive current count (DAC count) from 46 DAC to 96 DAC counts. The specific value for N may be chosen based on providing a desired level of accuracy in detecting SOP switching while not excessively prolonging the backend test. Suitable values for N include values from about 20 to about 200 frames. In one exemplary embodiment, N may be selected as 100 so that 100 frames of data on SOP switching or stability are acquired at each drive current count from 46 to 96 DAC counts.

Figure 5:
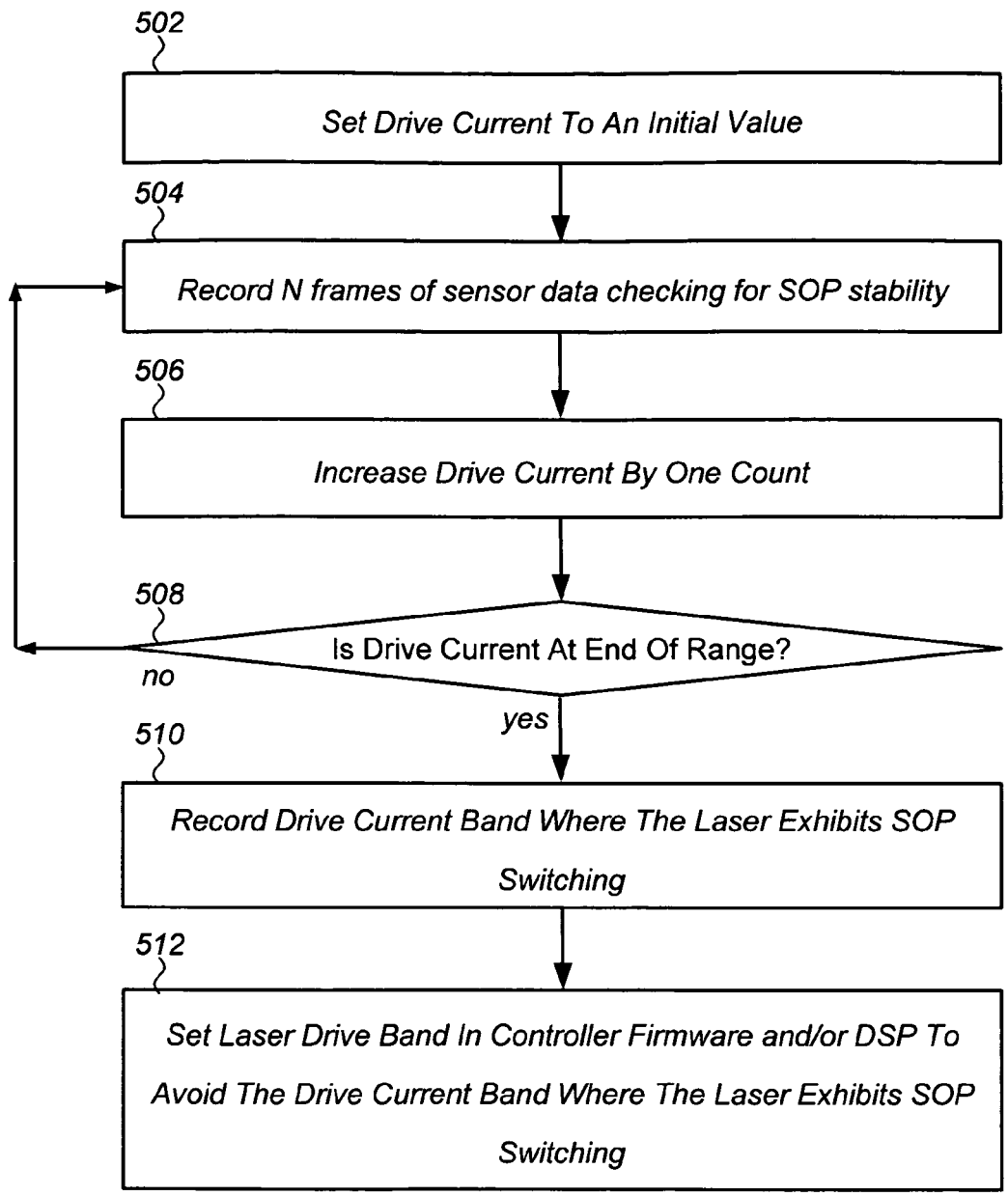
FIG. 5 may be a flowchart illustrating an embodiment of a method for screening a semiconductor laser.

Referring to FIG. 5, the method begins in a first block (block 502) with setting the drive current to an initial value. Next, N frames of sensor data are acquired from the sensor-array and DSP at a rate of 40 KHz and the data checked for SOP switching using an algorithm or method, described in detail below with reference to the flowchart of FIG. 5, for determining when there may be SOP switching (block 504). The drive current count stored in the drive current control register may be indexed or increased by one count (block 506), and the drive current count stored in the drive current control register examined to determine if the drive current count may be at the end of the range to be tested (block 508). If the drive current count may be not at the end of the range, blocks 504 and 506 are repeated to acquire N frames of sensor data at the new, increased drive current count. If the drive current count may be at the end of the range, a drive current band where the laser exhibits SOP switching (SOP unstable zone) may be recorded (block 508). Finally, the ONS FW can be set or programmed to avoid the SOP unstable zone where the laser exhibits a high rate or number of occurrences of SOP switching (block 512).

Figure 6:
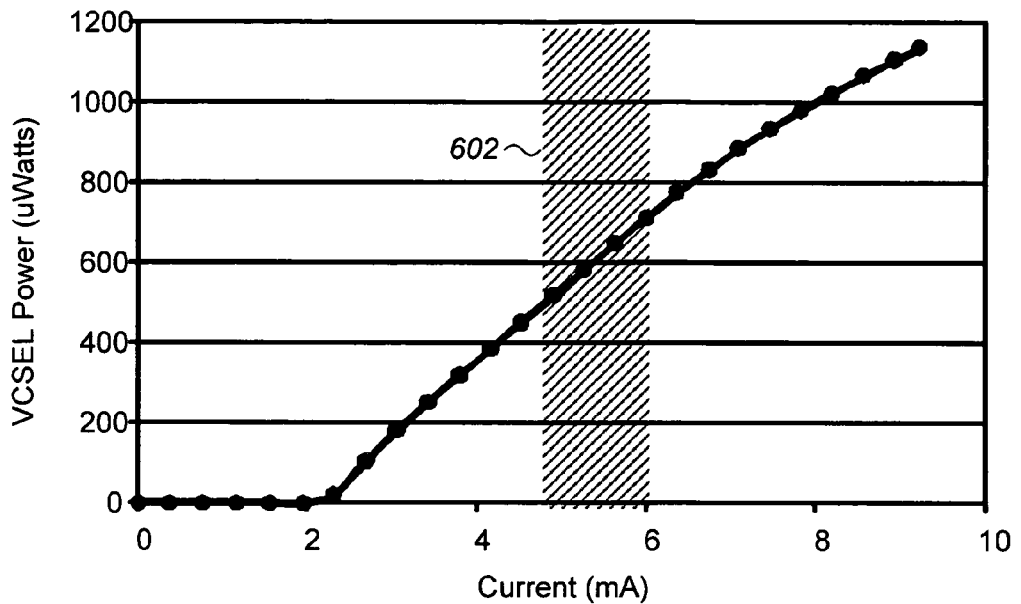
FIG. 6 may be a graph of VCSEL output power as a function of drive current and illustrating a range of drive currents in which operation may be excluded due to the SOP instability according to an embodiment.
Figure 7:
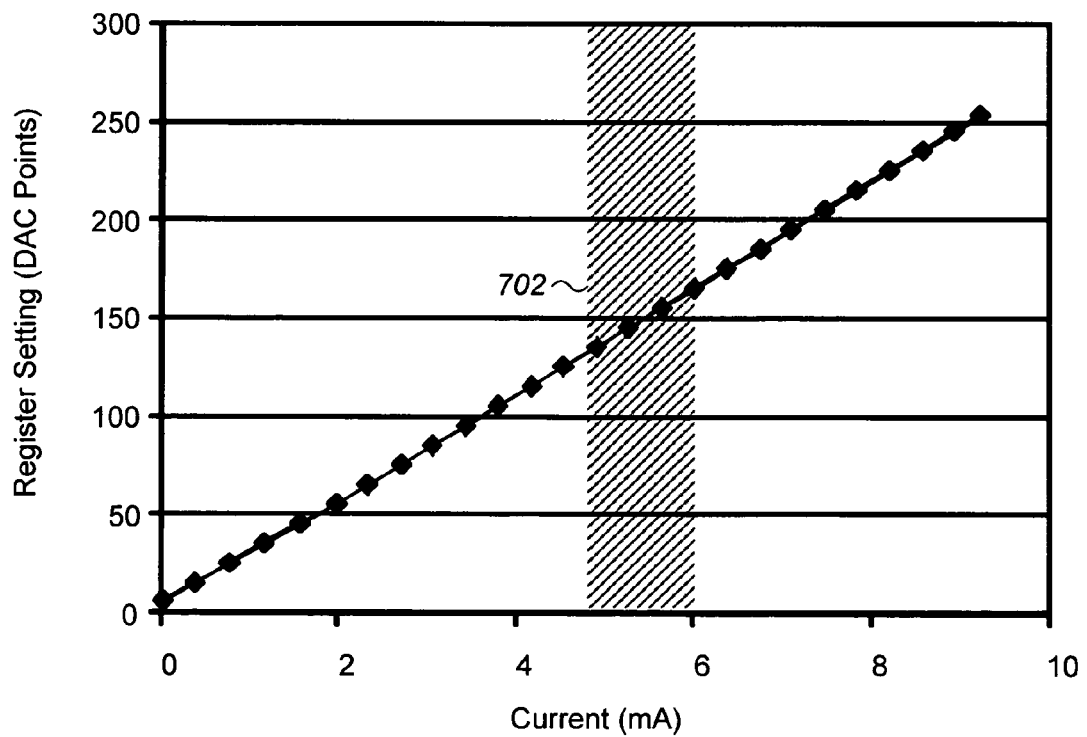
FIG. 7 may be a graph of a register setting as a function of drive current and illustrating the SOP unstable zone according to an embodiment.

An exemplary embodiment of programming the FW may be illustrated by FIGS. 6 and 7. FIG. 6 may be a graph of VCSEL output power in $\mu$Watts as a function of drive current and illustrating a range of drive currents 602 in which operation may be excluded due to the SOP instability. FIG. 7 illustrates the translation of these excluded currents into register settings (DAC points), which may then be programmed into the FW to exclude operation in the SOP unstable zone 702.

Figure 8:
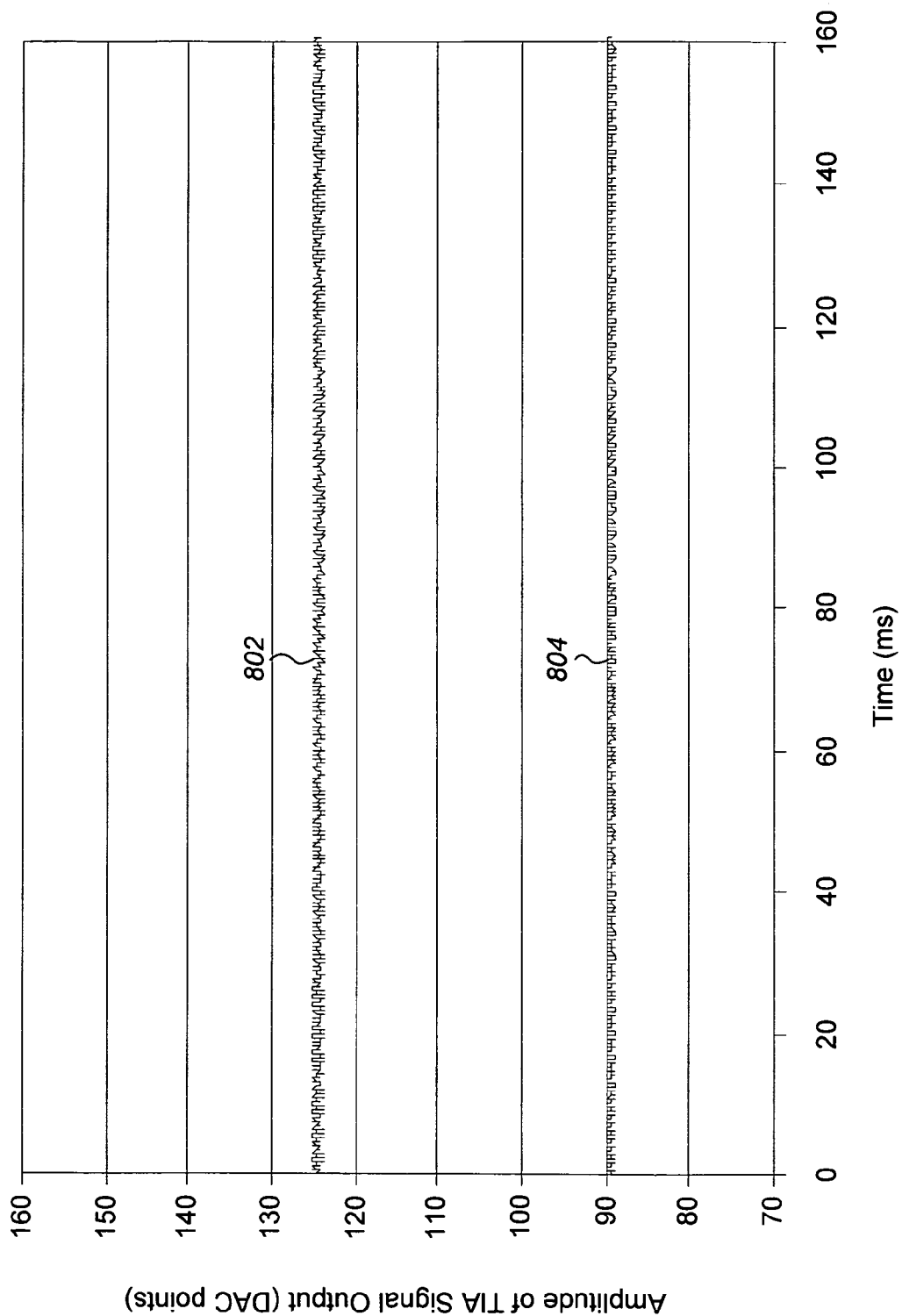
FIG. 8 may be a graph illustrating outputs of two trans-impedance amplifiers (TIA) channels of an ONS not exhibiting SOP switching according to an embodiment.
Figure 9:
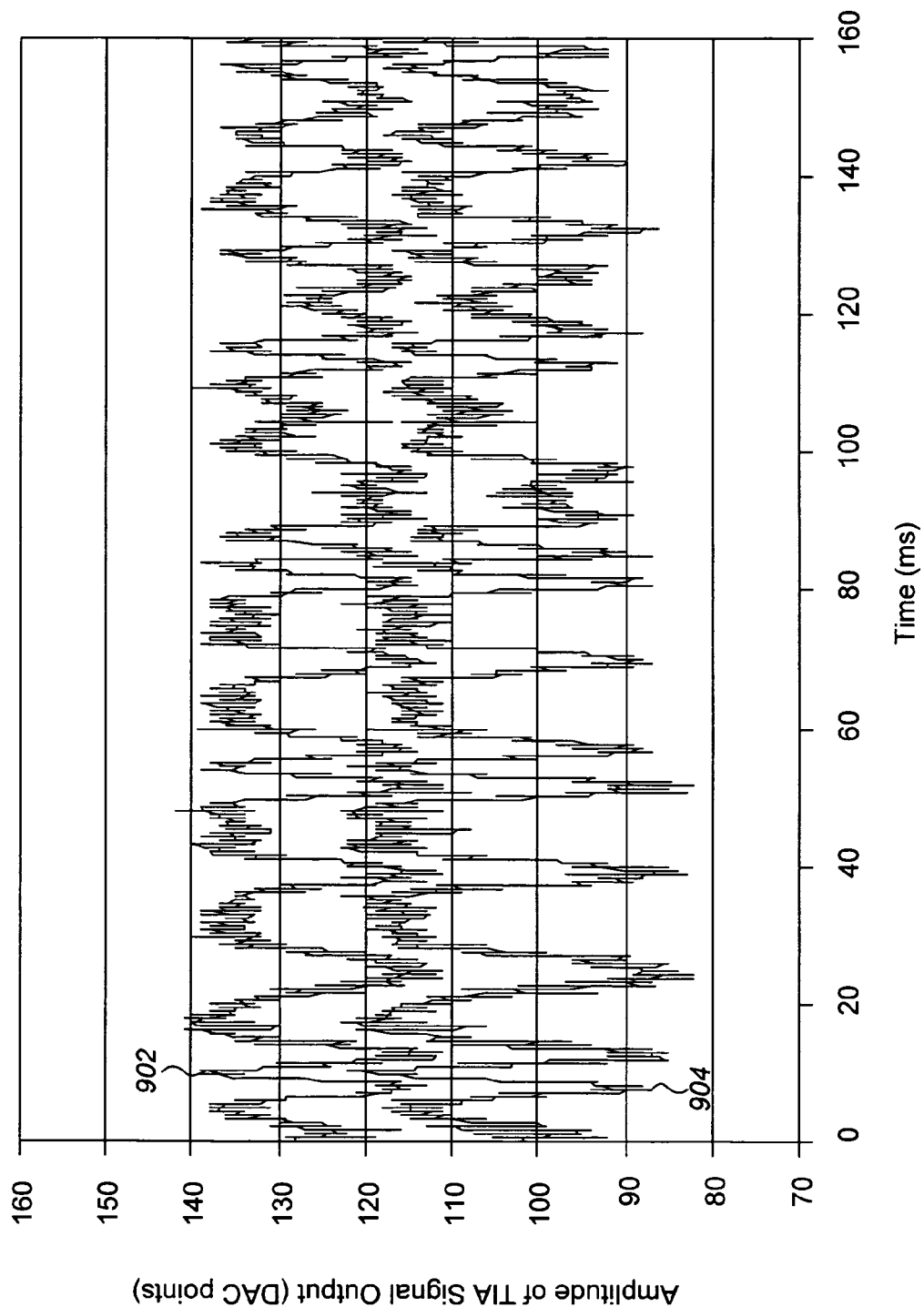
FIG. 9 may be a graph illustrating outputs of two TIA channels of an ONS exhibiting SOP switching according to an embodiment.

An algorithm or method for checking sensor data for SOP switching will now be developed or explained with reference to the graphs of FIGS. 8 through 10B. The data may be acquired by monitoring or measuring differential signals from one or more TIA channels of the ONS. FIG. 8 may be a plot or graph showing differential signals from two TIA channels (Ch1 802 and Ch2 804) where the laser may be exhibiting substantially no SOP switching. In FIG. 8, it may be seen that differential signal fluctuation may be within a few counts, for example +/−2 counts as shown in this figure. FIG. 9 may be a plot or graph showing how the differential signals from the same two TIA channels (Ch1 902 and Ch2 904) would appear if the laser may be exhibiting SOP switching. Referring to FIG. 9, it may be seen that differential signals from the TIA channels are very unstable, having signal fluctuations in the tens of counts, for example of up to about +/−20 counts as shown in this figure. With VCSEL SOP switching, the signal fluctuations become larger than if there may be no SOP switching. Evidence of SOP switching can be further shown by analyzing statistical behavior of the signal discussed in the following section.

Figure 10A:
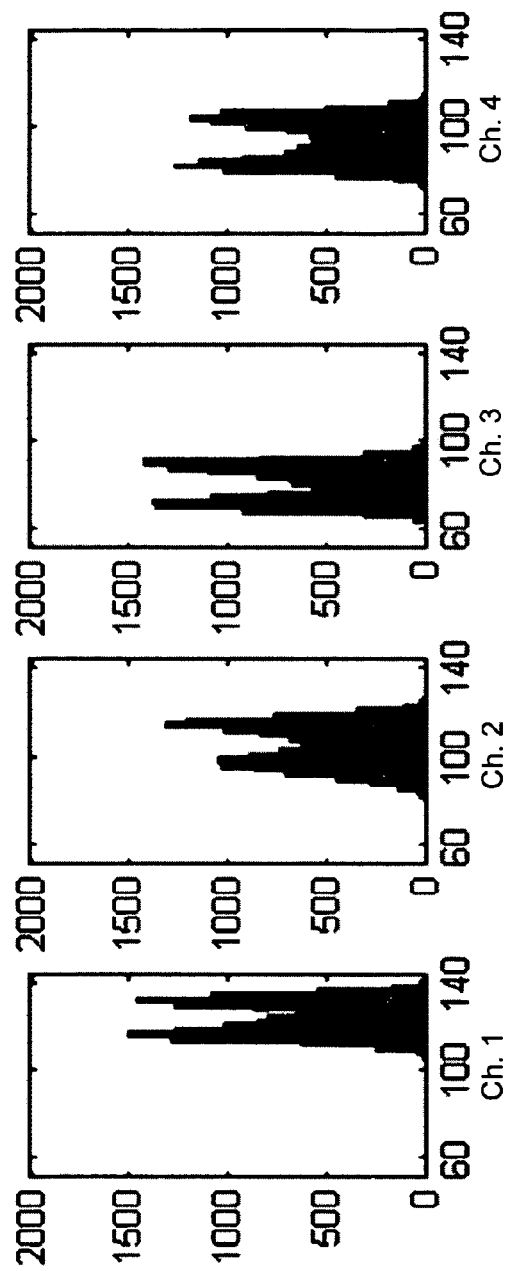
FIG. 10A are histograms of four TIA channels of an ONS operating at a drive current near a peak SOP switching current and exhibiting SOP switching according to an embodiment.
Figure 10B:
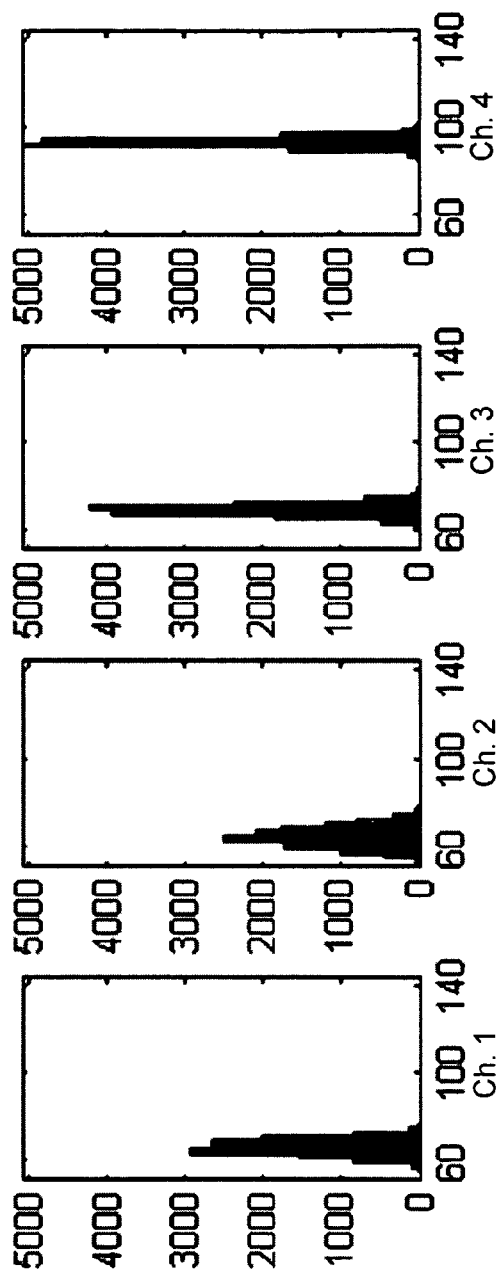
FIG. 10B are histograms of four TIA channels of an ONS operating at a drive current not exhibiting SOP switching according to an embodiment.

If there may be evidence of SOP switching in the TIA channels, the major characteristics of distribution of SOP switching in the differential signals can be more clearly shown using histograms. FIG. 10A may be histograms of four TIA channels (Ch. 1 through Ch. 4) of an ONS with a semiconductor laser (VCSEL) operating in a current near a peak SOP switching current. Histograms for each of the TIA channels in FIG. 8A show a double peak "Gaussian" type of distribution. However, for differential signals obtained from real motion (or no motion at all) for the same laser (VCSEL) and not operating in or near a peak SOP switching current, the TIA channels normally follow a clean single peak Gaussian distribution (see FIG. 10B). An algorithm can now be defined based on this unique feature, of a single peak Gaussian distribution for differential signals from a laser not exhibiting SOP switching or hopping unit, and a double peak Gaussian distribution for differential signals from a laser operating at or near a peak SOP switching current.

Figure 11:
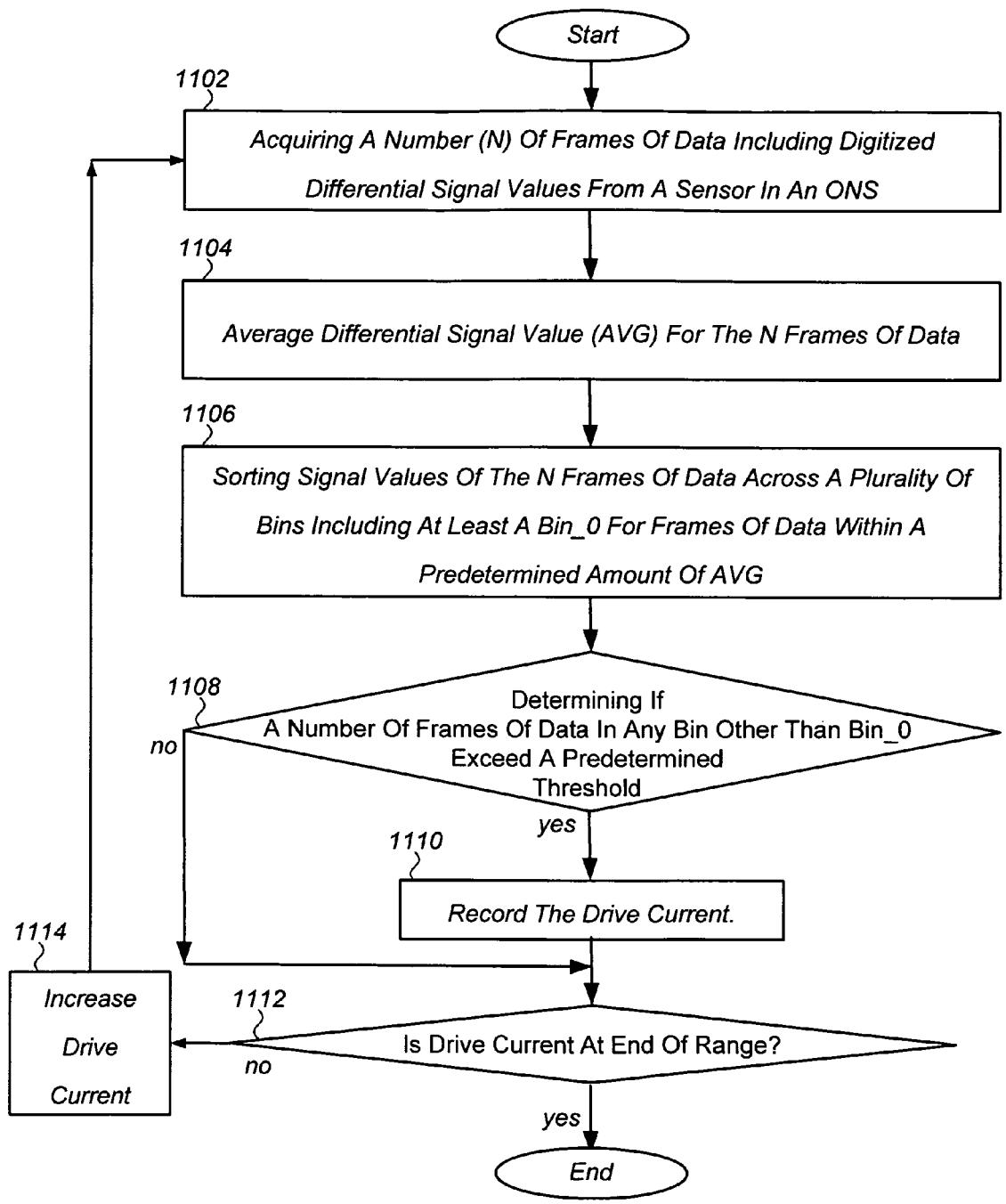
FIG. 11 may be a flowchart illustrating an embodiment of a method for determining drive currents at which the laser exhibits SOP switching.

An embodiment of an algorithm or method for identifying or checking for SOP switching that can be used in block 504 of FIG. 5 above will now be described with reference to the flowchart of FIG. 11. Referring to FIG. 11, the method begins in a first block (block 1102) with acquiring a number (N) of frames of data from a sensor in an ONS, the data including digitized differential signal values. As noted above, the specific value for N may be chosen based on providing a desired level of accuracy while not excessively prolonging the backend test. Suitable values for N include values from about 20 to about 200 frames. Next, an average signal value (AVG) for the N frames of data may be calculated (block 1104). The signal values for the N frames of data may then be sorted across a plurality of bins including at least a bin_0 for frames of data having within a predetermined amount of the average signal (AVG) (block 1106). In one embodiment the signal values can be sorted across a plurality (m) of bins centered around the calculated average signal (AVG), e.g. Bin_0 [AVG−2.0 to AVG+2.0]. Bin size can be chosen to be 1 to a few counts. It can be adjusted from case to case in order to maximize efficiency. Other bins in the plurality of bins can include, for example, Bin_−1 [AVG−2.0 to AVG−4.0], Bin_+1[AVG+2.0 to AV+4.0], Bin_−2 [AVG−4.0 to AVG−6.0] . . . . Bin_+m [AVG+2m to AVG+(2m+2)]. The plurality of bins can be visually analogized to the histograms of FIGS. 10A and 10B.

Next, it may be determined if data value in any bin other than Bin_0 exceed a predetermined threshold value relative to Bin_0 (block 1108). The presence of a value of data in any bin other than bin_0 beyond the predetermined threshold suggests a double peak Gaussian distribution for the differential signals indicating the laser may be operating at an SOP unstable drive current. If the data in any bin other than bin_0 exceeds the predetermined threshold, the drive current applied while acquiring the N frames of data may be recorded as an SOP unstable drive current (block 1110). After recording the SOP unstable drive current, or if no data in data in any bin other than bin_0 exceeds the predetermined threshold, the DAC count may be checked to see if the drive current may be at the end of the range (block 1112). If the drive current may be not at the end of the range the drive current count may be incremented or increased (block 1114), and blocks 1102 to 1112 repeated. If the drive current may be at the end of the range, the algorithm or method ends, and the SOP unstable drive current recorded in block 1110 passed to block 510 of the backend test method described above to determine and record an SOP unstable zone.

Figure 12:
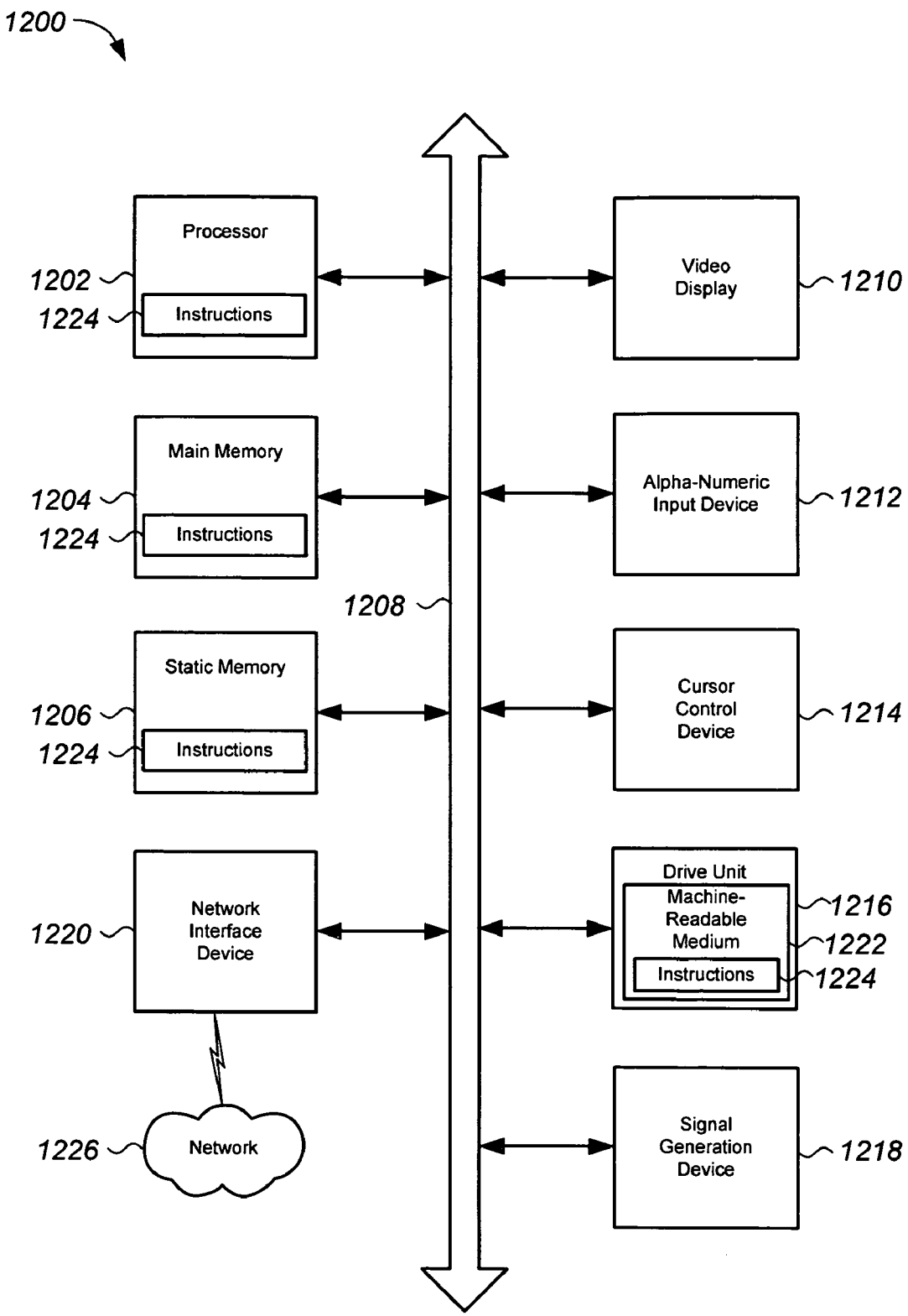
FIG. 12 shows a diagrammatic representation of a machine in the exemplary form of a computer system within which a set of instructions, for causing the machine to perform any one or more of the methodologies, processes, or operations discussed herein, may be executed, according to an embodiment.

FIG. 12 shows a diagrammatic representation of a machine in the form of a computer system 1200 within which a set of instructions, for causing the machine to perform any one or more of the methodologies, processes, or operations discussed herein, may be executed. In some embodiments, the computer system 1200 may be used for screening semiconductor lasers to identify drive currents associated with the SOP unstable zone, and programming the ONS' firmware or certain control blocks in the DSP to avoid operating the laser in the SOP unstable zone.

The machine can operate as a standalone device or, in alternative embodiments, may be connected (e.g., networked) to other machines. In a networked deployment, the machine may operate in the capacity of a server or a client machine in server-client network environment, or as a peer machine in a peer-to-peer (or distributed) network environment. The machine may be a server computer, a client computer, a personal computer (PC), a tablet PC, a set-top box (STB), a Personal Digital Assistant (PDA), a cellular telephone, a web appliance, a network router, switch or bridge, or any machine capable of executing a set of instructions (sequential or otherwise) that specify actions to be taken by that machine. Further, while only a single machine may be illustrated, the term "machine" shall also be taken to include any collection of machines that individually or jointly execute a set (or multiple sets) of instructions to perform any one or more of the methodologies discussed herein.

The example computer system 1200 includes a processor 1202 (e.g., a central processing unit (CPU) a graphics processing unit (GPU) or both), a main memory 1204 and a static memory 1206, which communicate with each other via a bus 1208. The computer system 1200 may further include a video display unit 1210 (e.g., a liquid crystal display (LCD) or a cathode ray tube (CRT)). The computer system 1200 also includes an alphanumeric input device 1212 (e.g., a keyboard), a cursor control device 1214 (e.g., an interface device), a disk drive unit 1216, a signal generation device 1218 (e.g., a speaker) and a network interface device 1220.

The disk drive unit 1216 includes a machine-readable medium 1222 on which may be stored one or more sets of instructions (e.g., software 1224) embodying any one or more of the methodologies or functions described herein. The software 1224 may also reside, completely or at least partially, within the main memory 1204 and/or within the processor 1202 during execution thereof by the computer system 1200, the main memory 1204 and the processor 1202 also constituting machine-readable media.

The software 1224 may further be transmitted or received over a network 1226 via the network interface device 1220.

While the machine-readable medium 1222 may be shown in an example embodiment to be a single medium, the term "machine-readable medium" should be taken to include a single medium or multiple media (e.g., a centralized or distributed database, and/or associated caches and servers) that store the one or more sets of instructions. The term "machine-readable medium" shall also be taken to include any medium that may be capable of storing, encoding, or carrying a set of instructions for execution by the machine and that cause the machine to perform any one or more of the methodologies of the present invention. The term "machine-readable medium" shall accordingly be taken to include, but not be limited to, solid-state memories, optical and magnetic media, and carrier wave signals.

Thus, embodiments of methods and systems for screening semiconductor lasers for use in ONS to suppress SOP switching have been described. Although the present disclosure has been described with reference to specific example embodiments, it will be evident that various modifications and changes may be made to these embodiments without departing from the broader spirit and scope of the invention. Accordingly, the specification and drawings are to be regarded in an illustrative rather than a restrictive sense.

The Abstract of the Disclosure may be provided to comply with 37 C.F.R. §1.72(b), requiring an abstract that will allow the reader to quickly ascertain the nature of the technical disclosure. It may be submitted with the understanding that it will not be used to interpret or limit the scope or meaning of the claims. In addition, in the foregoing Detailed Description, it can be seen that various features are grouped together in a single embodiment for the purpose of streamlining the disclosure. This method of disclosure may be not to be interpreted as reflecting an intention that the claimed embodiments require more features than are expressly recited in each claim. Rather, as the following claims reflect, inventive subject matter lies in less than all features of a single disclosed embodiment. Thus, the following claims are hereby incorporated into the Detailed Description, with each claim standing on its own as a separate embodiment.

In the forgoing description, for purposes of explanation, numerous specific details have been set forth in order to provide a thorough understanding of the control system and method of the present disclosure. It will be evident however to one skilled in the art that the present interface device and method may be practiced without these specific details. In other instances, well-known structures, and techniques are not shown in detail or are shown in block diagram form in order to avoid unnecessarily obscuring an understanding of this description.

Reference in the description to "one embodiment" or "an embodiment" means that a particular feature, structure, or characteristic described in connection with the embodiment may be included in at least one embodiment of the control system or method. The appearances of the phrase "one embodiment" in various places in the specification do not necessarily all refer to the same embodiment. The term "to couple" as used herein may include both to directly connect and to indirectly connect through one or more intervening components.

What is claimed is:

1. A method of screening a semiconductor laser comprising:
    (a) operating the laser at a first of a number (D) of discrete drive currents in a range of drive currents;
    (b) acquiring a number (N) of frames of data from a sensor in an optical navigation system (ONS) receiving speckle pattern in light from the laser reflected from a surface proximal to the ONS, the sensor data including differential signal values;
    (c) calculating an average differential signal value (AVG value) for the N frames of data;
    (d) sorting the N frames of data across a plurality of bins, the plurality of bins including at least a Bin_0 for frames of data having a differential signal value within a predetermined amount of the AVG value; and
    (e) determining if a number of frames of data in any of the plurality of bins other than Bin_0 exceed a predetermined threshold, and if the number of frames of data in any of the plurality of bins exceed the predetermined threshold, recording the drive current.

2. A method according to claim 1, wherein if the laser drive current is less than a predetermined maximum in the range of drive currents increasing the drive current to another of the number (D) of discrete drive currents repeating (b) through (e) until drive current equals the predetermined maximum.

3. A method according to claim 2, further comprising determining from the recorded drive currents an state of polarization (SOP) unstable zone.

4. A method according to claim 3, further comprising programming a controller in the ONS to drive the laser in a drive current range outside of the SOP unstable zone.

5. A method according to claim 4, further comprising determining the drive current range is below a predetermined maximum.

6. A method according to claim 3, further comprising repeating (b) through (e) until over a predetermined range of ambient temperatures to determine the SOP unstable zone over the range of ambient temperatures.

7. A method according to claim 1, further comprising calculating a root mean square (RMS) value of the differential signal values for the N frames of data at each drive current, and determining a state of polarization (SOP) unstable zone from the RMS value.

8. A method according to claim 1, wherein there is movement between the ONS and the surface during data acquisition.

9. A computer-readable medium, containing a set of instructions that causes a computer to perform a process comprising:
    (a) operating a laser for use in an optical navigation system (ONS) at a first of a number (D) of discrete drive currents in a range of drive currents;
    (b) acquiring a number (N) of frames of data from a sensor in an optical navigation system (ONS) receiving speckle pattern in light from the laser reflected from a surface proximal to the ONS, the sensor data including differential signal values;
    (c) calculating an average differential signal value (AVG value) for the N frames of data;
    (d) sorting the N frames of data across a plurality of bins, the plurality of bins including at least a Bin_0 for frames of data having a differential signal value within a predetermined amount of the AVG value; and
    (e) determining if a number of frames of data in any of the plurality of bins other than Bin_0 exceed a predetermined threshold, and if the number of frames of data in any of the plurality of bins exceed the predetermined threshold, recording the drive current.

10. A computer-readable medium according to claim 9, wherein if the laser drive current is less than a predetermined maximum in the range of drive currents the process further comprises increasing the drive current to another of the number (D) of discrete drive currents repeating (b) through (e) until drive current equals the predetermined maximum.

11. A computer-readable medium according to claim 10, wherein the process further comprises determining from the recorded drive currents a state of polarization (SOP) unstable zone.

12. A computer-readable medium according to claim 11, wherein the process further comprises programming a controller in the ONS to drive the laser in a drive current range outside of the SOP unstable zone.

13. A computer-readable medium according to claim 12, wherein the process further comprises determining the drive current range is below a predetermined maximum.

14. A computer-readable medium according to claim 11, wherein the process further comprises repeating (b) through (e) until over a predetermined range of ambient temperatures to determine the SOP unstable zone over the range of ambient temperatures.

15. A computer-readable medium according to claim 9, wherein the process further comprises calculating a root mean square (RMS) value of the differential signal values for the N frames of data at each drive current, and determining a state of polarization (SOP) unstable zone from the RMS value.

16. A system for screening a semiconductor laser comprising:
 a laser driver configured to operate the laser at a first of a number (D) of discrete drive currents in a range of drive currents;
 a sensor array configured to receive a speckle pattern in light from the laser reflected from a surface proximal to the sensor array and generate differential signal values in response thereto; and
 a computer configured to:
  (a) acquire a number (N) of frames of data from the sensor array, the data including differential signal values;
  (b) calculate an average differential signal value (AVG value) for the N frames of data;
  (c) sort the N frames of data across a plurality of bins, the plurality of bins including at least a Bin_0 for frames of data having a differential signal value within a predetermined amount of the AVG value;
  (d) determine if a number of frames of data in any of the plurality of bins other than Bin_0 exceed a predetermined threshold, and if the number of frames of data in any of the plurality of bins exceed the predetermined threshold record the drive current.

17. A system according to claim 16, wherein the computer is further configured to determine if the laser drive current is less than a predetermined maximum in the range of drive currents, increase the drive current to another of the number (D) of discrete drive currents and repeating (a) through (d) until drive current equals the predetermined maximum.

18. A system according to claim 17, wherein the computer is further configured to determine from the recorded drive currents a state of polarization (SOP) unstable zone, and to program a controller in the laser driver to drive the laser in a drive current range outside of the SOP unstable zone.

19. A system according to claim 16, wherein the computer is further configured to calculate a root mean square (RMS) value of the differential signal values for the N frames of data at each drive current, and determining a state of polarization (SOP) unstable zone from the RMS value.

20. A system according to claim 16, further comprising a number of actuators to provide relative motion between the sensor array and the surface during data acquisition.

* * * * *